United States Patent [19]

Frisch

[11] Patent Number: 4,833,350
[45] Date of Patent: May 23, 1989

[54] BIPOLAR-CMOS DIGITAL INTERFACE CIRCUIT

[75] Inventor: Arnold M. Frisch, Portland, Oreg.

[73] Assignee: Tektronix, Inc., Beaverton, Oreg.

[21] Appl. No.: 187,774

[22] Filed: Apr. 29, 1988

[51] Int. Cl.[4] ............... H03K 19/092; H03K 19/094; H03K 17/10; H03K 17/14

[52] U.S. Cl. .................................. 307/475; 307/264; 307/544; 307/558

[58] Field of Search ............... 307/475, 450, 451, 443, 307/585, 576, 579, 255, 270, 264, 350, 542, 568, 558, 491, 544; 323/315

[56] References Cited

U.S. PATENT DOCUMENTS

| | | | |
|---|---|---|---|
| 3,914,702 | 10/1975 | Gehweiler | 307/451 X |
| 4,348,596 | 9/1982 | Atherton et al. | 307/264 |
| 4,477,736 | 10/1984 | Onishi | 307/475 X |
| 4,477,737 | 10/1984 | Ulmer et al. | 307/491 X |
| 4,504,747 | 3/1985 | Smith et al. | 307/264 X |
| 4,578,600 | 3/1986 | Magee | 307/451 |
| 4,578,602 | 3/1986 | West et al. | 307/264 X |
| 4,647,793 | 3/1987 | Davis | 307/264 X |
| 4,719,369 | 1/1988 | Asano et al. | 307/475 X |

Primary Examiner—Stanley D. Miller
Assistant Examiner—David R. Bertelson
Attorney, Agent, or Firm—Mark M. Meininger; Robert S. Hulse

[57] ABSTRACT

A bipolar-CMOS (Bi-CMOS) digital interface circuit (50) of the present invention provides an interface between a bipolar digital circuit (52) and a CMOS digital circuit (54). The digital interface circuit includes a digital transform circuit (56) that receives a bipolar logic signal generated by the bipolar digital circuit and transforms the signal into an intermediate logic signal whose voltage waveform is positioned symmetrically about a logic threshold generated by a CMOS digital input circuit (58). The CMOS digital input circuit receives the intermediate logic signal and generates a CMOS logic signal that is delivered to the CMOS digital circuit, thereby to interface the CMOS digital circuit with the bipolar digital circuit.

15 Claims, 3 Drawing Sheets

BIPOLAR-CMOS DIGITAL INTERFACE CIRCUIT

TECHNICAL FIELD

The present invention relates to interface circuits that provide functional compatibility between digital electrical circuits of different logic families and, in particular, to a circuit that functions as an interface between a bipolar digital circuit and a complementary metal-oxide-semiconductor (CMOS) digital circuit.

BACKGROUND OF THE INVENTION

A digital electrical circuit is designed typically to function in accordance with the operating characteristics of one of a variety of logic families. These include a CMOS transistor-based family ("CMOS digital circuits") and any one of several bipolar junction transistor-based families ("bipolar digital circuits"), such as transistor-transistor logic (TTL) and emitter-coupled logic (ECL). Each logic family has different operating characteristics that render the family suitable for use under different operational constraints Although such circuits may be manufactured from any of a variety of semiconductor materials that include silicon and gallium arsenide, the following descriptions refer by way of example to the operating characteristics of circuits manufactured from silicon.

It is sometimes desirable to employ bipolar and CMOS digital components in different parts of a single digital integrated circuit, which is typically called a bipolar-CMOS (Bi-CMOS) circuit. As a first example, CMOS digital integrated circuits can be manufactured at such large scale integration that the operating frequencies of such circuits are limited more by the capacitance between interconnected CMOS transistors than by the switching speeds of the transistors themselves. Bipolar transistors configured as current amplifiers can be used to compensate for the rate-limiting capacitances in such large-scale CMOS digital circuits and thereby form Bi-CMOS digital circuits having higher operating frequencies than the CMOS digital circuits. As a second example, large-scale integration of CMOS and bipolar transistors in a single integrated circuit provides the capability of manufacturing "complete" electronic systems on such integrated circuits. The operating characteristics of uncompensated bipolar and CMOS digital circuits differ, however, in several respects and thereby render them difficult to interface.

In the case of bipolar digital circuits designed in accordance with the ECL family, a first difference is in the logic signal levels of ECL and bipolar digital circuits. If, for purposes of comparison, such circuits are operated from a $+5$ volt supply, the high and low logic signal levels of ECL circuits would typically be $+4.1$ and $+3.3$ volts, respectively; whereas, the high and low logic signal levels of high-density CMOS circuits would typically be $+5$ volts and 0 volts, respectively. A second difference is that the logic signal voltage levels of ECL circuits change in response to temperature variations; whereas, the logic signal voltage levels of CMOS circuits are substantially constant over a wide range of operating temperatures. A third difference is that the n- and p-channel field-effect transistors employed in CMOS circuits typically have different threshold voltage characteristics and are very sensitive to variations in manufacturing processes; whereas, the bias voltage of the npn bipolar junction transistors employed in ECL circuits are comparatively insensitive to variations in manufacturing processes. The different threshold voltage characteristics of the n- and p-channel transistors in a CMOS digital circuit can cause the low and high logic signalthreshold levels to vary between 30% and 70% of the supply voltage and thereby cause different propagation delays for the high and low logic signals.

An interface circuit that provides functional compatibility between an ECL circuit driving a CMOS circuit should, therefore, compensate for the different ECL and CMOS logic signal voltage levels, compensate for temperature-related changes in ECL logic signal voltage levels, and provide a common CMOS logic signal threshold. U.S. Pat. No. 4,578,600 of Magee describes a CMOS buffer circuit that provides a common logic threshold for the high and low CMOS logic signal levels. The logic threshold is purportedly substantially independent of the different threshold voltage characteristics of n- and p-channel field-effect transistors used in the circuit.

The CMOS buffer circuit of Magee comprises a prior art CMOS inverter 10, a diagram of which is shown in FIG. 1. Inverter 10 includes a n-channel transistor 12 and a p-channel transistor 14 whose respective gate terminals 16 and 18 are electrically connected and whose respective drain terminals 20 and 22 are electrically connected. Gate terminals 16 and 18 form the input terminal 24 of inverter 10, and drain terminals 20 and 22 form the output terminal 26 of inverter 10. The source terminal 28 of n-channel transistor 12 is electrically connected to a negative voltage supply conductor, $-V_{dd}$, and the source terminal 30 of p-channel transistor 14 is electrically connected to a positive voltage supply conductor, $+V_{dd}$, such that source terminals 28 and 30 form the bias voltage terminals of inverter 10. Inverter 10 provides at output terminal 26 an inverted CMOS logic signal relative to a CMOS logic signal applied to input terminal 24.

FIG. 2 shows a diagram of inverter 10 employed in the CMOS buffer circuit 32 of Magee. A pair of p- and n-channel offset transistors 34 and 36 provide offset voltages to n- and p-channel transistors 12 and 14, respectively. The offset voltages are developed and are applied to n- and p-channel transistors 12 and 14 as follows. The gate 38 and drain 40 terminals of p-channel offset transistor 34 are electrically connected to the negative voltage supply conductor, $-V_{dd}$. The p-channel offset transistor 34 provides to its source terminal 42 and to the source terminal 28 of n-channel transistor 12 the voltage, $-V_{dd}$, offset by an amount proportional to the p-channel threshold voltage. Similarly, the gate 44 and drain 46 terminals of n-channel offset transistor 36 are electrically connected to the positive voltage supply conductor, $+V_{dd}$. The n-channel offset transistor 36 provides to its source terminal 48 and to the source terminal 30 of p-channel transistor 14 the voltage, $+V_{dd}$, offset by an amount proportional to the n-channel threshold voltage. The input 24 and output 26 terminals of inverter 10 constitute the respective input and output terminals of buffer circuit 32.

The p- and n-channel offset transistors 34 and 36 together with the respective n- and p-channel transistors 12 and 14 of the inverter 10 form two symmetric pairs of complementary transistors, which cooperate to provide a logic threshold that is substantially independent of the different threshold voltage characteristics of the n- and p-channel transistors 12 and 14. This arrangement provides a stable logic threshold voltage that is midway between the voltages $-V_{dd}$ and $+V_{dd}$. By comparison, inverter 10 without offset transistors 34 and 36 would have an imprecisely known logic threshold voltage that is generated by the varying threshold voltage characteristics of n-channel transistor 12 and p-channel transistor 14.

The CMOS buffer circuit 32 of Magee provides, however, suboptimal performance because of a high output impedance caused by negative current feedback during the switching of inverter 10. (Any output current flows through the impedance of one of the offset transistors 34 and 36, thereby decreasing the effective available drive voltage for transistors 12 and 14.) This reduces the ability of buffer circuit 32 to drive interconnect and load capacitance and limits the operation of the circuit to a maximum switching speed of about an order of magnitude slower than that of inverter 10 alone. The CMOS buffer circuit of Magee is, therefore, too slow to be employed in an interface between bipolar and CMOS digital circuits.

SUMMARY OF THE INVENTION

An object of the present invention is, therefore, to provide a circuit that functions as an interface between a bipolar digital circuit and a CMOS digital circuit.

Another object of this invention is to provide such a circuit that is capable of relatively high speed operation.

A further object of this invention is to provide such a circuit that has a common logic threshold for the high and low logic signal levels of a CMOS digital circuit.

Yet another object of this invention is to provide such a circuit that transforms the logic signal output voltage levels of a bipolar digital circuit to the logic signal input voltage levels of a CMOS digital circuit.

The present invention is a bipolar-CMOS (Bi-CMOS) digital interface circuit that functions as an interface between a bipolar digital circuit and a CMOS digital circuit. The interface circuit includes a CMOS digital input circuit and a digital transform circuit. The digital input circuit provides a common logic threshold for the high and low logic signal levels of a CMOS digital circuit. The digital transform circuit receives from the bipolar digital circuit a bipolar logic signal which the transform circuit positions symmetrically about the common logic threshold and amplifies to high and low logic signal voltage levels that are compatible with the digital input circuit.

In a preferred embodiment, the CMOS digital input circuit comprises a variation of the CMOS buffer circuit 32 shown in FIG. 2. The CMOS buffer 32 is reconfigured so that input terminal 24 and output terminal 26 are electrically connected.

This configuration functions as a voltage offset circuit that generates an offset positive supply voltage at source terminal 48 of n-channel transistor 36 and an offset negative supply voltage at source terminal 42 of p-channel transistor 34.

A pair of similar voltage follower amplifiers receive different ones of the offset positive supply and offset negative supply voltages. The outputs of the voltage followers deliver the offset positive supply and offset negative supply voltages to different ones of the bias voltage terminals of a CMOS inverter circuit. The input and output terminals of the inverter constitute the respective input and output terminals of the digital input circuit.

The digital input circuit provides a common logic threshold for the high and low logic signal levels. The low-impedance outputs of the voltage follower amplifiers replace the output impedances present at source terminals 42 and 48 of respective transistors 34 and 36, thereby enabling the digital input circuit to operate at a speed of about half that of the inverter circuit alone. By comparison, the buffer circuit 32 of Magee is limited to a maximum switching speed that is about an order of magnitude slower than that of the inverter circuit alone.

The digital transform circuit is formed of bipolar junction transistors and transforms a bipolar logic signal so that it is positioned symmetrically about the common logic threshold generated by the CMOS digital input circuit. The digital transform circuit receives at its inputs complementary ECL digital output signals comprising a common mode voltage and signal voltages of opposite polarities. The transform circuit cancels the common mode voltages and develops a current proportional to one of the signal voltage components.

In a preferred embodiment, the complementary ECL digital signals are adapted so that a first current generating stage receives a current proportional to a first one of the ECL digital signals, and a second current generating stage receives a current proportional to the common mode voltage. The stages cooperate with respective current mirrors that receive bias signals for offsetting the outputs of the stages. A conductor electrically connected between the current mirrors causes the current that is proportional to the common mode voltage to cancel the common mode voltage component of the current that is proportional to the ECL digital signal. As a result, the digital transform circuit generates an output signal that is proportional to the signal voltage component of the ECL digital signal and includes amplification and offsets provided by the bias signals.

The digital transform circuit amplifies and offsets the signal voltage component such that the ECL digital signal is transformed into a CMOS-compatible intermediate digital signal. The offset provided by the digital transform circuit is selected so that the intermediate logic signal levels are positioned symmetrically about the common logic threshold generated by the CMOS digital input circuit. The amplification is selected so that the voltages of the intermediate logic signal levels are approximately equal to the voltages generated by the offset transistors of the CMOS digital input circuit. The transformation circuit together with the CMOS digital input circuit provides, therefore, a Bi-CMOS digital interface circuit that compensates for the major operational differences between bipolar and CMOS digital circuits.

Additional objects and advantages of the present invention will be apparent from the following detailed description of preferred embodiments thereof, which proceeds with reference to the accompanying drawings.

DETAILED DESCRIPTION OF PREFERRED EMBODIMENTS

Figure 3:
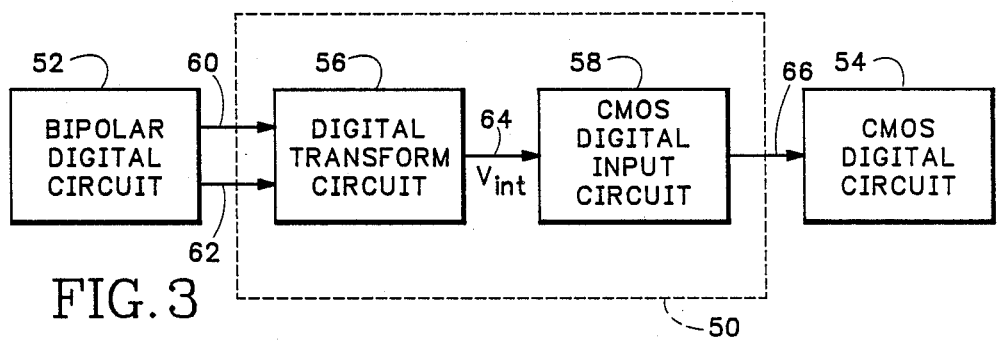
FIG. 3 is an electrical block diagram of a bipolar-CMOS digital interface circuit of the present invention for receiving bipolar compatible logic signals and developing CMOS compatible logic signals.

With reference to FIG. 3, an interface circuit 50 of the bipolar-CMOS (Bi-CMOS) type provides an interface between a digital circuit 52 formed of bipolar transistors (hereafter "bipolar circuit 52") and a digital circuit 54 formed of CMOS transistors (hereafter "CMOS circuit 54"). Bipolar digital circuit 52 can be, and is described herein only by way of example as, an emitter-coupled logic ("ECL") digital circuit. It will be appreciated that CMOS circuit 54 could alternatively be a Bi-CMOS digital circuit having an input stage configured from CMOS transistors.

Interface circuit 50 includes a digital transform circuit 56 and a CMOS digital input circuit 58 that cooperate to receive ECL-compatible input signals and develop CMOS-compatible output signals. Digital transform circuit 56 includes input terminals 60 and 62 that receive complementary ECL-compatible logic output signals D and $\overline{D}$, respectively, from bipolar circuit 52. Digital transform circuit 56 generates from the ECL-compatible signals an intermediate logic signal whose voltage waveform is positioned symmetrically about a common logic threshold established by CMOS digital input circuit 58. CMOS digital input circuit 58 receives at its input terminal 64 the intermediate logic signal and generates from it a CMOS-compatible output signal that is applied to an input terminal 66 of CMOS circuit 54.

Figure 1:
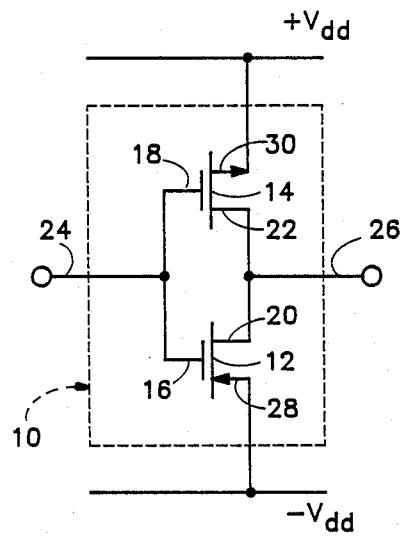
FIG. 1 is a circuit diagram of a prior art CMOS inverter circuit.
Figure 2:
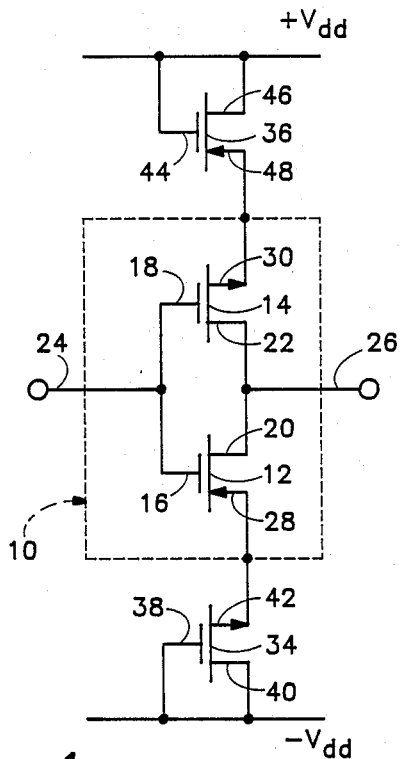
FIG. 2 is a circuit diagram of a prior art CMOS buffer circuit.
Figure 4:
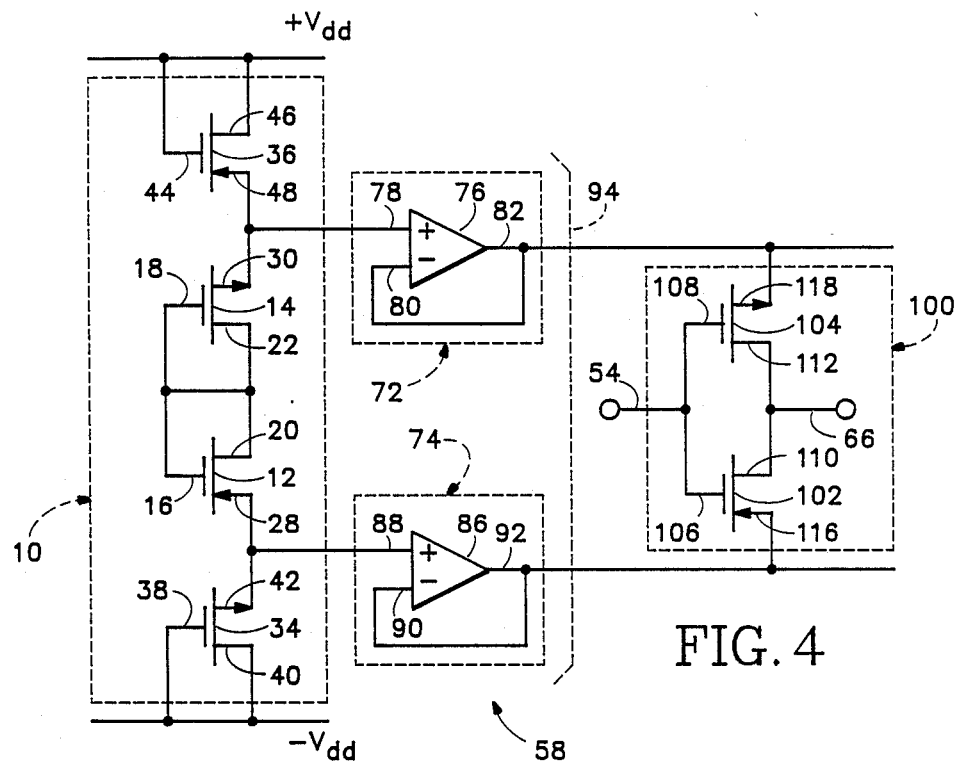
FIG. 4 is an electrical circuit diagram of a preferred embodiment of the CMOS digital input circuit of the present invention.

With reference to FIG. 4, CMOS digital input circuit 58 includes a voltage offset means or circuit 70 that generates voltage offsets proportional to the threshold voltages of n- and p-channel metal-oxide-semiconductor (MOS) field-effect transistors. Voltage offset circuit 70 is similar to the CMOS buffer circuit 32 of Magee (FIG. 2) but is reconfigured so that the input terminal 24 and output terminal 26 of CMOS buffer circuit 32 are electrically connected. Voltage offset circuit 70 generates a negative supply offset voltage at source terminal 42 of p-channel transistor 34 and a positive supply offset voltage at source terminal 48 of n-channel transistor 36.

A pair of similar voltage follower amplifiers 72 and 74 receive the positive supply offset voltage and the negative supply offset voltage, respectively. Voltage follower 72 includes an operational amplifier 76 having a positive input terminal 78 that receives the positive supply offset voltage from source terminal 48 of n-channel transistor 36. The negative input terminal 80 of operational amplifier 76 is connected to its output terminal 82. Similarly, voltage follower 74 includes an operational amplifier 86 having a positive input terminal 88 that receives the negative supply offset voltage from source terminal 42 of p-channel transistor 34. The negative input terminal 90 of operational amplifier 86 is connected to its output terminal 92. Voltage followers 72 and 74 function as an impedance transforming means or circuit 94 that effectively reduces the output impedances present at source terminal 48 of n-channel transistor 36 and source terminal 42 of p-channel transistor 34.

Output terminals 82 and 92 of voltage followers 72 and 74 deliver the positive supply and negative supply offset voltages to different ones of the bias voltage terminals of a CMOS inverter circuit 100. CMOS inverter 100 includes an n-channel transistor 102 and a p-channel transistor 104 whose respective gate terminals 106 and 108 are electrically connected and whose respective drain terminals 110 and 112 are electrically connected. Inverter 100 receives the positive supply offset voltage at the source terminal 118 of p-channel transistor 104 and the negative supply offset voltage at the source terminal 116 of n-channel transistor 102.

Gate terminals 106 and 108 form the input terminal 64 of CMOS digital input circuit 58, and drain terminals 110 and 112 form the output terminal of interface circuit 50, which output is connected to input terminal 66 of CMOS circuit 54. Inverter 100 functions as a combined logic inverter and logic converter that provides an inverted CMOS-compatible logic signal to CMOS circuit 54 in response to an intermediate logic signal $V_{int}$ applied to its input terminal 64.

Transistors of the n- and p-channel types are referred to herein as being "complementary" to each other. The p- and n-channel offset transistors 34 and 36 together with the respective n- and p-channel transistors 102 and 104 of the inverter 100 form two symmetric pairs of complementary transistors. These two symmetric pairs cooperate to provide a logic threshold that is substantially independent of the different threshold voltage characteristics of the n- and p-channel transistors 102 and 104. This arrangement provides a common, stable logic threshold across which the output voltage waveform of inverter 100 switches from low to high logic signal levels and from high to low logic signal levels. In particular, with positive and negative supply voltages of +5 volts and +0 volts, respectively, the common logic threshold becomes +2. volts.

The impedance transforming function of voltage followers 72 and 74 allows digital input circuit 58 to operate at minimum speed that is about half that of a CMOS logic inverter circuit alone. The speed of operation is reduced because the voltage difference between source terminals 116 and 118 is approximately one-half the voltage difference between the positive and negative power supply conductors. The speed at which a CMOS digital circuit operates is proportional to the magnitude of the difference between the positive and negative voltages.

It will be appreciated that multiple inverters 100 could be electrically connected to outputs 82 and 92 of operational amplifiers 76 and 86, respectively, thereby allowing digital input circuit 58 to operate in a multi-channel fashion.

Figure 5:
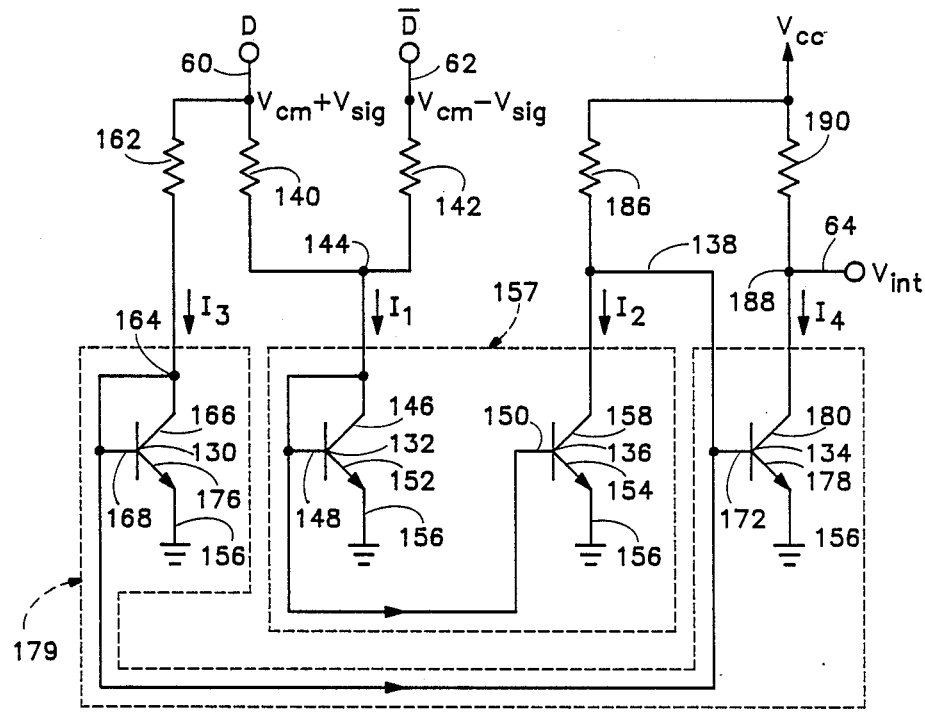
FIG. 5 is an electrical circuit diagram of a preferred embodiment of the digital transform circuit of the present invention.

With reference to FIG. 5, digital transform circuit 56 includes a first diode-connected NPN bipolar junction transistor 130 configured to function as a first current generating stage and a second diode-connected NPN bipolar junction transistor 132 configured to function as a second current generating stage. Transistors 130 and 132 receive currents proportional to an ECL digital output signal, D, and an ECL common mode voltage, $V_{cm}$, respectively. The ECL digital output signal D comprises the common mode voltage $V_{cm}$ and a signal voltage component $V_{sig}$ of either positive or negative polarity. Currents generated by transistors 130 and 132 are delivered to a pair of NPN bipolar junction transistors 134 and 136, respectively, which are configured to function as current mirrors. Transistors 134 and 136 cooperate through a conductor 138 to generate the intermediate logic signal $V_{int}$ whose voltage is proportional to the signal voltage $V_{sig}$ and whose voltage waveform is positioned symmetrically about the common logic threshold established by CMOS digital input circuit 58, as described below in greater detail.

A first input resistor 140 of 2 kilohms and a second input resistor 142 of 2 kilohms that have a common circuit node 144 receive complementary ECL-compatible compatible logic input signals D and $\overline{D}$, respectively. The logic input signals D and $\overline{D}$ include, for example, the signal voltage components $+V_{sig}$ and $-V_{sig}$, respectively. As a result, currents flowing through input resistors 140 and 142 are proportional to, respectively, the signal voltage components $+V_{sig}$ and $-V_{sig}$, which cancel each other so that circuit node 144 receives a current $I_1$ proportional to the common mode voltage $V_{cm}$. In particular, for a value "2R" for each of resistors 140 and 142, the current $I_1$ is represented as:

$$I_1 \approx [V_{cm} + V_{sig}]/2R + [V_{cm} - V_{sig}]/2R$$
$$\approx V_{cm}/R.$$

The current $I_1$ is delivered to the collector terminal 146 and base terminal 148 of transistor 132 and the base terminal 150 of transistor 136. The emitter terminals 152 and 154 of the respective transistors 132 and 136 are connected to a ground potential 156. Transistors 132 and 136 form a first connected pair of transistors 157, and transistor 136 generates in its collector terminal 158 a current $I_2$ that is approximately equal to the current $I_1$.

A third input resistor 162 of 1 kilohm receives the ECL-compatible input signal D and delivers to a circuit node 164 a current $I_3$ that is proportional to the voltage of the input signal D, i.e., the sum of the common mode voltage $V_{cm}$ and the signal voltage component $V_{sig}$. In particular, for a value "R" for resistor 164, the current $I_3$ is represented as:

$$I_3 \approx [V_{cm} + V_{sig}]/R.$$

The current $I_3$ is delivered to the collector terminal 166 and base terminal 168 of transistor 130 and the base terminal 172 of transistor 134. The emitter terminals 176 and 178 of the respective transistors 130 and 134 are connected to ground potential 156. Transistors 130 and 134 form a second connected pair of transistors 179, and transistor 134 generates in its collector terminal 180 a current $I_4$ that is proportional to the current $I_3$.

Conductor 138 causes the current in collector terminal 158 to be subtracted from that in collector terminal 180. As a result, the current $I_4$ is approximately equal to the current $I_3$ minus the current $I_2$ but is enhanced by a biasing current generated by a first biasing resistor 186 of 6 kilohms. Resistor 186 is connected between an ECL voltage supply $V_{cc}$ and collector terminal 158 of transistor 136. For a value "6R" for resistor 186, the current $I_4$ is represented as:

$$I_4 \approx I_3 - I_2 + V_{cc}/6R$$
$$\approx [V_{cm} + V_{sig}]/R - V_{cm}/R + V_{cc}/6R$$
$$\approx [6V_{sig} + V_{cc}]/6R.$$

Digital transform circuit 56 generates at a circuit node 188 the intermediate logic signal $V_{int}$ that is delivered to input 64 of CMOS digital input circuit 58. The intermediate logic signal $V_{int}$ is approximately equal to the difference between the ECL supply voltage $V_{cc}$ and a voltage generated across a second biasing resistor 190 of 3 kilohms. Resistor 190 is connected between ECL voltage supply $V_{cc}$ and circuit node 188 and generates an offset voltage that is proportional to the current $I_4$. In particular, for a value "3R" for resistor 190, the intermediate logic signal $V_{int}$ is represented as:

$$V_{int} \approx V_{cc} - I_4 \times 3R$$
$$\approx V_{cc} - ([6V_{sig} + V_{cc}]/6R) \times 3R$$
$$\approx V_{cc}/2 - 3V_{sig}.$$

As a result, the ECL logic signal D is transformed into an intermediate logic signal $V_{int}$ whose voltage waveform is positioned symmetrically about the common logic threshold generated by digital input circuit 58. The ECL logic signal D is also amplified to have high and low logic signal level that are compatible with digital input circuit 58.

In particular, with the ECL supply voltage $V_{cc}$ equal to about +5 volts, the $V_{22}/2$ term in the above equation corresponds to an offset voltage of +2.5 volts, which is the magnitude of the voltage of the common logic threshold generated by digital input circuit 58. With the signal voltage $V_{sig}$ being about ±0.4 volts, the high and low logic signal voltages of intermediate logic signal $V_{int}$ are +3.7 and +1.3 volts, respectively. Logic signal voltages of +3.7 and +1.3 volts are of appropriate magnitudes for driving digital input circuit 58 into respective high and low CMOS logic states.

The above-described derivations of the magnitudes of the currents are first-order approximations and are provided for purposes of illustration. Leakage currents are present in the circuit and are amplified in accordance with the betas of the different, interconnected transistors. To partially compensate for these leakage currents, each of the transistors 130, 132, and 136 is configured to have exemplary emitter dimensions of 1 micron ×3 microns, and transistor 134 is configured to have exemplary emitter dimensions of 1 micron ×12 microns, thereby to reduce further the effects of the leakage currents. Moreover, the nominal values of resistance for resistors 140, 142, 162, 186, and 190 are changed to 6 kilohms, 6 kilohms, 3 kilohms, 18 kilohms, and 4.5 kilohms, respectively.

Digital transform circuit 56 and digital input circuit 58 employ different power supplies of 0 to +5 volts and about +1.25 to +3.75 volts, respectively, to improve the suppression of electrical noise. In particular, there is a relatively small voltage difference between high and low logic signal levels of an ECL digital signal. Relatively small voltage spikes that are generated by a CMOS power supply but do no affect a CMOS digital circuit could cause an ECL digital signal to be misread. The separate power supplies for digital transform circuit 56 and digital input circuit 58 help to prevent such errors.

Figure 6:
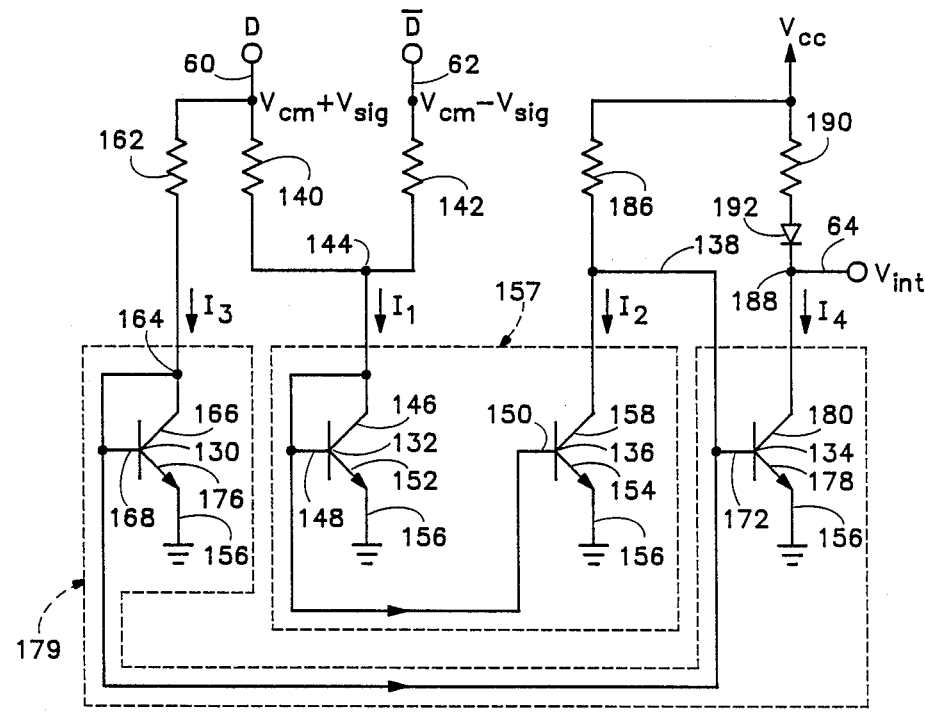
FIG. 6 is an electrical circuit diagram of an alternative embodiment of the digital transform circuit of the present invention.

FIG. 6 shows digital transform circuit 56 modified to include a Schottky diode 192 electrically connected between resistor 190 and circuit node 188. Diode 192 provides the digital transform circuit 56 of FIG. 6 with improved temperature compensating characteristics. In addition to diode 192, circuit 56 of FIG. 6 is further modified in that the nominal values of resistance for resistors 140, 142, 162, 186, and 192 are 6 kilohms, 6 kilohms, 3 kilohms, 30 kilohms, and 1.9 kilohms, respectively.

It will be obvious to those having skill in the art that many changes may be made in the abovedescribed details of the preferred embodiments of the present invention without departing from the underlying principles thereof. The scope of the present invention should be determined, therefore, only by the following claims.

I claim:

1. A complementary metal-oxide-semiconductor (CMOS) digital input circuit that switches between first and second CMOS logic states, comprising:

first and second supply voltage conductors carrying respective first and second CMOS supply voltages;

voltage offset means for offsetting the first and second CMOS supply voltages by amounts proportional to threshold voltages of respective first and second complementary transistors of the field-effect type thereby to generate first and second CMOS supply offset voltages;

impedance transforming means having first and second low-impedance outputs and receiving the first and second CMOS supply offset voltages for providing them to the respective first and second low-impedance outputs; and an output stage including third and fourth transistors of the field-effect type complementary to the respective first and second transistors, the third and fourth transistors having source terminals receiving the respective first and second CMOS supply offset voltages, gate terminals electrically connected to form an input terminal, and drain terminals electrically connected to form an output terminal, whereby the output stage establishes a logic threshold voltage between the first and second CMOS logic states to provide a CMOS logic signal to the output terminal in response to a logic signal applied to the input terminal and in accordance with the relative voltages of the logic threshold and the logic signal.

2. The circuit of claim 1 in which the impedance transforming means includes first and second buffer amplifiers that receive the respective first and second supply offset voltages.

3. The circuit of claim 2 in which each of the first and second buffer amplifiers includes a voltage follower amplifier.

4. The circuit of claim 1 in which the first transistor has a gate terminal and a drain terminal that are electrically connected to the first supply voltage conductor and the second transistor has a gate terminal and a drain terminal that are electrically connected to the second supply voltage conductor and in which the voltage offset means includes fifth and sixth transistors of the field-effect type complementary to the respective first and second transistors, the fifth and sixth transistors having source terminals electrically connected to the source terminals of the respective first and second transistors and having gate terminals and drain terminals electrically connected to one another.

5. A digital transform circuit for transforming a bipolar logic signal so that its voltage waveform is positioned symmetrically about a preselected logic threshold, the bipolar logic signal including a signal voltage component and a common mode voltage component, comprising:

first and second current mirrors electrically connected to first and second current generating stages that receive first and second input currents of magnitudes proportional to the common mode voltage component and the bipolar logic signal, respectively;

first and second bias sources electrically connected to the respective first and second current mirrors for generating bias signals that offset by preselected amounts the signals generated by the first and second current generating stages; and a conductor electrically connected between the first and second current mirrors so that they cooperate to generate an output signal proportional to the difference between the first and second input currents and positioned symmetrically about the preselected logic threshold.

6. The circuit of claim 5 in which each current generating stage and its associated current mirror include respective first and second transistors of the bipolar junction type configured so that:

(a) the base terminals of the first and second transistors are electrically connected, (b) the emitter terminals of the first and second transistors are electrically connected to a common supply voltage, (c) the base terminal and collector terminal of the first transistor are electrically connected and receive one of the first and second input currents, and (d) the collector terminal of the second transistor is electrically connected to the corresponding one of the first and second bias sources.

7. The circuit of claim 6 in which the conductor is electrically connected between the collector terminal of the second transistor of the first current mirror and the base terminals of the first and second transistors of the respective second current generating stage and second current mirror.

8. The circuit of claim 5 further comprising temperature compensating means for increasing the temperature range over which the digital transform circuit is operational.

9. The circuit of claim 8 in which the temperature compensating means comprises a diode electrically connected between the second current mirror and the second bias source.

10. The circuit of claim 5 in which the bipolar logic signal is an emitter-coupled logic digital signal.

11. An interface circuit electrically connected between a bipolar digital circuit that generates a bipolar logic signal and a complementary metal-oxide-semiconductor((CMOS) digital circuit that receives a CMOS logic signal, the interface circuit receiving the bipolar logic signal and generating a corresponding CMOS logic signal, the bipolar logic signal including a signal voltage component and a common mode voltage component, comprising:

a digital transform circuit that receives the bipolar logic signal and generates from it an intermediate logic signal having a preselected voltage offset and a signal component that is proportional to the signal voltage component of the bipolar logic signal; and a CMOS digital input circuit that provides a common logic threshold for first and second CMOS logic signal levels, the common logic threshold having a voltage that is approximately equal to the preselected voltage offset of the intermediate logic signal, the digital input circuit receiving the intermediate logic signal and generating in response to it a CMOS logic signal.

12. The circuit of claim 11 in which the CMOS digital input circuit includes:

first and second supply voltage conductors carrying respective first and second CMOS supply voltages;

voltage offset means for offsetting the first and second CMOS supply voltages by amounts proportional to threshold voltages of respective first and second complementary transistors of the field-effect type thereby to generate first and second CMOS supply offset voltages;

impedance transforming means having first and second low-impedance outputs and receiving the first and second CMOS supply offset voltages for providing them to the respective first and second low-impedance outputs, respectively; and an output stage including third and fourth transistors of the field-effect type complementary to the respective first and second transistors, the third and fourth transistors having source terminals receiving the respective first and second CMOS supply offset voltages, gate terminals electrically connected to form an input terminal, and drain terminals electrically connected to form an output terminal, whereby the output stage cooperates with the voltage offset means to establish the common logic threshold.

13. The circuit of claim 11 in which the digital transform circuit includes:

first and second current mirrors electrically connected to first and second current generating stages that receive first and second input currents of magnitudes proportional to the common mode voltage component and the bipolar logic signal, respectively;

first and second bias sources electrically connected to the respective first and second current mirrors for generating bias signals that offset by preselected amounts the signals generated by the first and second current generating stages; and a conductor electrically connected between the first and second current mirrors so that they cooperate to generate the intermediate logic signal.

14. A method of transforming a bipolar logic signal so that its voltage waveform is compatible with that of a CMOS logic signal, the bipolar logic signal including a signal voltage component and a common mode voltage component, the method comprising:

canceling the common mode voltage component of the bipolar logic signal;

offsetting the signal voltage component so that its voltage waveform is positioned generally symmetrically about a CMOS logic threshold; and amplifying the signal voltage component so that its amplitude is compatible with the amplitude of a CMOS logic signal.

15. The method of claim 14 in which the CMOS logic threshold is generated by a CMOS digital input circuit.

* * * * *